219-121 SR
MTR04 XR 3,866,398

(3)

United States Patent [19] [11] 3,866,398

Vernon, Jr. et al. [45] Feb. 18, 1975

[54] IN-SITU GAS-PHASE REACTION FOR REMOVAL OF LASER-SCRIBE DEBRIS

[75] Inventors: Robert Donvin Vernon, Jr.; Robert E. Holloway, both of Sherman, Tex.

[73] Assignee: Texas Instruments Incorporated, Dallas, Tex.

[22] Filed: Dec. 20, 1973

[21] Appl. No.: 426,887

[52] U.S. Cl. .............................. 156/17, 219/121 L
[51] Int. Cl. .............................. H01l 7/50
[58] Field of Search ......... 219/121 L; 156/7, 16, 17; 29/580, 583

[56] References Cited

UNITED STATES PATENTS

| | | | |
|---|---|---|---|
| 3,360,398 | 12/1967 | Garibotti | 117/212 |
| 3,417,222 | 12/1968 | Cannon et al. | 219/121 L |
| 3,524,038 | 8/1970 | O'Kelly | 219/121 L |
| 3,626,141 | 12/1971 | Daly | 219/121 L |
| 3,649,806 | 3/1972 | Konig | 219/121 L |

*Primary Examiner*—William A. Powell
*Attorney, Agent, or Firm*—Harold Levine; James T. Comfort; Gary C. Honeycutt

[57] ABSTRACT

The disclosure relates to the prevention of the deposition of silicon debris upon active circuit areas of semiconductor devices during laser scribing of a semiconductor slice. The method and apparatus involves the introduction of a gaseous reagent into the region of silicon vaporization at the point where the laser beam vaporizes the silicon slice. The vaporized silicon has extremely high thermal energy and therefore combines with the reagent gas to form gaseous compounds therewith which are exhausted through a vacuum scavenging system or to form a non-reactive solid material which does not degrade the silicon slice or the metallization thereon. In this way, the silicon vapors which are formed at the kerf are removed from the system and cannot deposit as detrimental slag onto the active portions of the silicon slice.

16 Claims, 1 Drawing Figure

PATENTED FEB 18 1975 3,866,398

IN-SITU GAS-PHASE REACTION FOR REMOVAL OF LASER-SCRIBE DEBRIS

Figure 1:
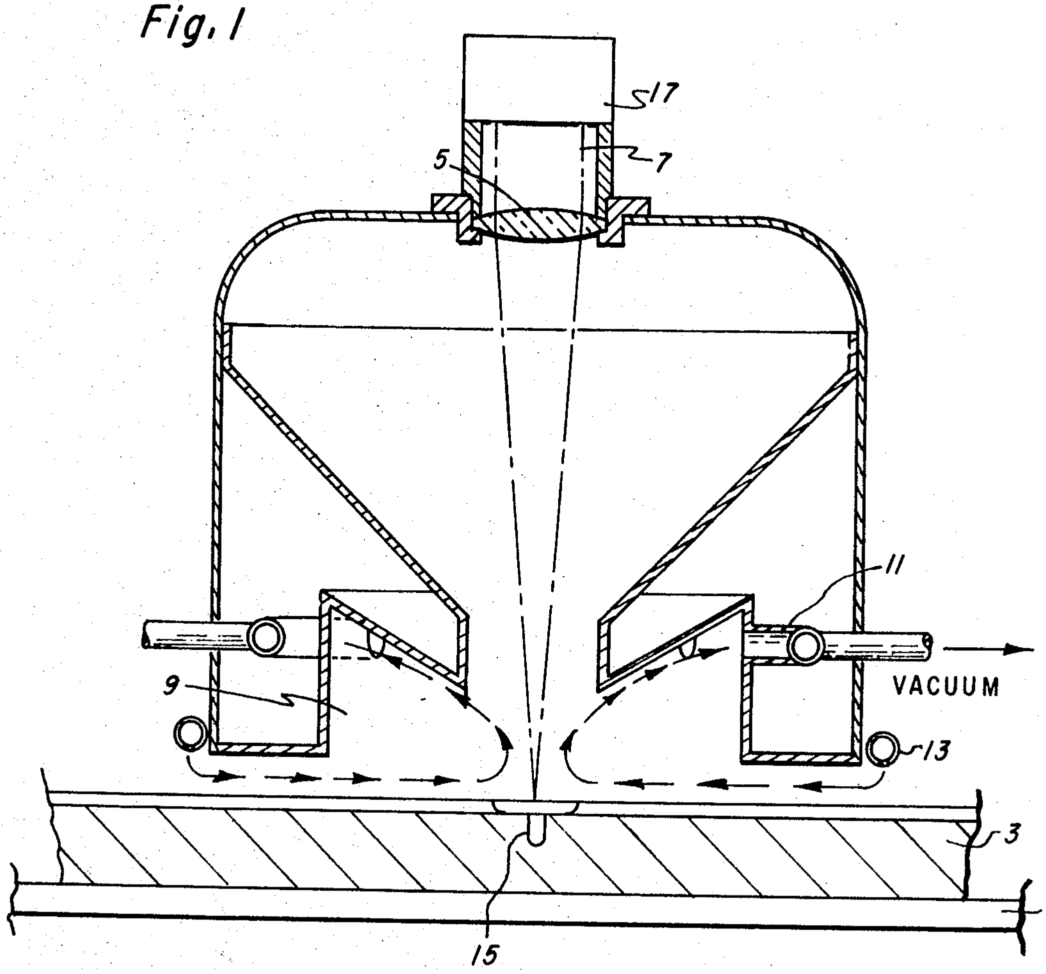

This invention relates to the removal of laser-scribe debris and, more specifically, to the use of a localized reaction with the vaporized silicon from a silicon slice subjected to a laser beam, with a reagent, which combines with the silicon in its vaporized and high-thermal energy state to form a gaseous silicon compound which is easily removed by a vacuum system or a non-reactive solid material which does not degrade the silicon slice or the metallization thereon.

Despite recent improvements in vacuum-scavenging systems, silicon debris deposited on active circuit areas of a semiconductor chip or slice continues to hamper acceptance of laser scribing as a method for separating integrated circuit bars. Silicon ejected from the kerf of the silicon slice due to laser scribing is in vapor form, but rapidly condenses into solid particles which adhere to the surface of the slice and which interfere with wire bonding. The debris adheres strongly to gold metallization and can react with the gold to form gold-silicon eutectic mixtures when the bar is heated above 377°C; i.e., the gold-silicon eutectic temperature, when performing the well-known packaging process steps.

The prior art has attempted to overcome this problem by the ultrasonic agitation of the silicon slice after laser scribing in deionized water for removal of tenacious silicon debris. The exposure of the silicon slice to water has, however, been demonstrated to cause a reliability exposure problem resulting from "lace-etch" corrosion of aluminum interconnect metallization.

Protective overcoats of photo-resist or other organic materials have been successfully used to keep the debris from depositing on surfaces; however, such processes are expensive and present a reliability exposure problem due to the potential of bond adhesion problems caused by organic residue.

The above problems of the prior art are overcome and there is provided a relatively inexpensive system and method for removing laser-scribe debris with minimum reliability exposure of the silicon slice. In accordance with the present invention, a laser beam is directed along scribe lines or scribing areas of a silicon slice for the purpose of separating the integrated circuits thereon. The laser beam will cause silicon vapor to be ejected from the kerf in the silicon slice, this silicon vapor being of extremely high thermal energy. A gaseous flow of a reagent is then injected into the air drawn into the cutting chamber and directed to the reaction zone directly above the kerf where the silicon vapor is formed. In the reaction area directly above the kerf, the silicon vapor is sufficiently high thermal energy to effect a localized reaction between the silicon vapor and the normally non-reactive reagent vapors. The silicon vapor which normally coalesces and redeposits as slag is thereby converted to gaseous compounds which are exhausted through the vacuum scavenging system within the hood or to form a non-reactive solid material which does not degrade the silicon slice or the metallization thereon. This prevents or substantially minimizes the deposition of slag onto the active areas of the silicon slice.

It is therefore an object of the present invention to provide a system and method for removal of laser-scribe debris.

It is a further object of this invention to provide a system and method for removal of laser-scribe debris wherein the silicon vapor is combined with a gaseous compound to form a gaseous compound which is removable under vacuum from the vacuum scavenging system or form a non-reactive solid material which does not degrade the silicon slice or the metallization thereon.

It is a yet further object of this invention to combine extremely high thermal energy silicon vapor with a reagent material in a laser-scribing system to prevent deposition of debris onto the silicon slice.

The above objects and still further objects of the invention will immediately become apparent to those skilled in the art after consideration of the following preferred embodiment thereof, which is provided by way of example and not by way of limitation wherein:

The FIGURE is a diagram of a laser-scribing and silicon removal system for performing the method of the present invention.

Referring now to the FIGURE, there is shown a cutting chamber for cutting semiconductor slices by means of a laser beam. The system includes a support 1 on which a silicon slice 3, which is to be scribed, is properly positioned in well-known manner so that scribing areas will be properly positioned thereon. The support 1 is preferably a motorized *x–y* table which moves the slice along a predetermined path. The system further includes a laser 17 for providing a laser beam of substantially monochromatic light and therefore minimal dispersion directed toward the silicon slice 3. Any laser normally used for silicon scribing can be used herein. The laser beam 7 is focused through a microscopic objective lens 5 as shown in the FIGURE. A chamber 9 is provided which encloses the objective lens 5 therein which is gasketed thereto to prevent air leakage and has in the side walls thereof a vacuum system for removal of gases within the chamber via the vacuum ports 11 formed within the chamber. The chamber 9 is positioned over the silicon slice 3 to provide a space for the introduction of room air into the chamber. Also provided is perforated tubing 13 through which reagent gases are introduced into the system along with the room air. The reagent gas along with the room air is forced along to the reaction zone where the laser beam will meet and impinge upon the silicon slice. The reagent will combine with the high thermal energy gaseous silicon to form a gaseous silicon compound. This gas is then drawn out of the chamber through the vacuum system. The reagent gas can also be formulated to form a non-reactive solid material upon reaction with the high thermal energy silicon.

In practice, the laser beam will be projected via lens 5 onto the silicon slice 3 and, while cutting the silicon slice at the kerf 15, will cause the vaporization of the silicon residue. The silicon, which is vaporized, is of extremely high thermal energy when in the region of the kerf which is known as the reaction zone. This silicon vapor normally coalesces and redeposits as slag onto the silicon slice. However, due to the introduction of the reagent gas which is injected into the air drawn into the cutting chamber through the perforated tubes 13 encircling the scavenger shroud chamber 9, a reaction takes place in the reaction zone between the reagent gas and the extremely high thermal energy silicon vapor. The reagent gas when reacting with the silicon vapor forms either a volatile compound which is evacuated from the reaction chamber through the vacuum ports 11, or a non-reactive solid material, thereby minimizing or preventing the deposition of the slag onto the silicon slice.

The reagent gas, which is introduced in excess into the air stream, is introduced at the area of impingement of the laser beam on the slice 3 in excess of stoichiometric requirement and can be oxygen, chlorine, a halocarbon, tetrofluoromethane or difluorodichloromethane, sulfur hexafluoride or any other gaseous reagent which will react with extremely high thermal energy silicon in the region of the kerf 15 and form therewith either a volatile compound which can be expelled through the vacuum system while being inert to the silicon slice and any metallization or the like thereon or a non-reactive solid such as a silicon oxide.

It should also be noted that though the reagent gas has been shown to be injected into the reaction zone by injection thereof into the air drawn into the cutting chamber, greater efficiency would be obtained by direct injection of the reagent gas into the reaction zone, thereby providing an increased concentration of the reagent gas at the reaction zone.

While the silicon slices which are scribed in accordance with the apparatus and method described above display a dramatic decrease in the amount and particle size of redeposit and debris, it has been found that subsequent non-aqueous cleaning, such as with ultrasonic Freon, removes virtually all traces of debris from the circuit surfaces on the silicon slice. It should also be noted that although the laser machining or cutting system has been described with regard to a silicon slice, by proper choice of reagents, this gas phase reaction process would be applicable for removal of debris from laser machining or cutting operations on virtually any material.

It can be seen that there has been demonstrated an in-situ gas phase process and system which improves the cleanliness of silicon integrated circuits after laser scribing. This process, when used with a properly adjusted laser scriber, permits elimination of the requirement for protective overcoats or post scribe cleanups as required in the prior art.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of removal of laser-scribe debris, which comprises the steps of:

a. providing a device to be scribed,
b. directing a laser beam along predetermined points on said device to be scribed so that said beam impinges on said device,
c. directing a reagent gas, which forms a volatile compound or a solid compound inert to said device with material from said device volatilized by said laser beam, to the immediate area of impingement of said laser beam on said device, and
d. continually removing gases from the immediate area of impingement of said laser beam on said device.

2. A method of removal of laser-scribe debris as set forth in claim 1 wherein said device is positioned within a chamber, said gases being removed from said chamber.

3. A method of removal of laser-scribe debris as set forth in claim 1 wherein said reagent gas is taken from the class consisting of halocarbon gases, halosulfur gases, chlorine and oxygen.

4. A method of removal of laser-scribe debris as set forth in claim 2 wherein said reagent gas is taken from the class consisting of halocarbon gases, halosulfur gases, chlorine and oxygen.

5. A method of removal of laser-scribe debris as set forth in claim 1 wherein said device is formed substantially of silicon.

6. A method of removal of laser-scribe debris as set forth in claim 2 wherein said device is formed substantially of silicon.

7. A method of removal of laser-scribe debris as set forth in claim 3 wherein said device is formed substantially of silicon.

8. A method of removal of laser-scribe debris as set forth in claim 4 wherein said device is formed substantially of silicon.

9. A method of removal of laser-scribe debris as set forth in claim 1 wherein said reagent gas is directed to said area of impingement of said beam on said device in excess of stoichiometric requirement.

10. A method of removal of laser-scribe debris as set forth in claim 2 wherein said reagent gas is directed to said area of impingement of said beam on said device in excess of stoichiometric requirement.

11. A method of removal of laser-scribe debris as set forth in claim 3 wherein said reagent gas is directed to said area of impingement of said beam on said device in excess of stoichiometric requirement.

12. A method of removal of laser-scribe debris as set forth in claim 4 wherein said reagent gas is directed to said area of impingement of said beam on said device in excess of stoichiometric requirement.

13. A method of removal of laser-scribe debris as set forth in claim 5 wherein said reagent gas is directed to said area of impingement of said beam on said device in excess of stoichiometric requirement.

14. A method of removal of laser-scribe debris as set forth in claim 6 wherein said reagent gas is directed to said area of impingement of said beam on said device in excess of stoichiometric requirement.

15. A method of removal laser-scribe debris as set forth in claim 7 wherein said reagent gas is directed to said area of impingement of said beam on said device in excess of stoichiometric requirement.

16. A method of removal of laser-scribe debris as set forth in claim 8 wherein said reagent gas is directed to said area of impingement of said beam on said device in excess of stoichiometric requirement.

* * * * *